(12) United States Patent
Lee (10) Patent No.: US 11,508,774 B2
(45) Date of Patent: Nov. 22, 2022

(54) IMAGE SENSOR DEVICE (71) Applicant: SK hynix Inc., Gyeonggi-do (KR)

(72) Inventor: Sung Ryong Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/007,837

(22) Filed: Aug. 31, 2020

(65) Prior Publication Data

US 2021/0313377 A1 Oct. 7, 2021

(30) Foreign Application Priority Data

Apr. 1, 2020 (KR) .................. 10-2020-0039786

(51) Int. Cl.
*H01L 27/146* (2006.01)
*H01L 23/48* (2006.01)
*H01L 21/768* (2006.01)

(52) U.S. Cl.
CPC ...... *H01L 27/14636* (2013.01); *H01L 23/481* (2013.01)

(58) Field of Classification Search
CPC .................. H01L 23/481; H01L 27/14636
See application file for complete search history.

(56) References Cited

U.S. PATENT DOCUMENTS

| | | | |
|---|---|---|---|
| 5,952,704 A | 9/1999 | Yu et al. | |
| 8,217,484 B2 | 7/2012 | Park | |
| 8,576,318 B2 | 11/2013 | Lee et al. | |
| 8,853,705 B2 | 10/2014 | Lee et al. | |
| 8,963,272 B2 | 2/2015 | Maekawa et al. | |
| 9,030,584 B2 | 5/2015 | Dai | |
| 9,666,630 B2 | 5/2017 | Chuang et al. | |
| 9,978,797 B2 | 5/2018 | Sasaki | |
| 2004/0141421 A1 | 7/2004 | Cheng et al. | |
| 2008/0191297 A1* | 8/2008 | Yang ................ | H01L 27/14618 257/432 |
| 2009/0085143 A1 | 4/2009 | Park | |
| 2010/0045837 A1* | 2/2010 | Yamashita ........ | H01L 27/14609 348/308 |
| 2011/0042825 A1* | 2/2011 | Ito .......................... | H01L 25/18 257/774 |
| 2011/0227180 A1* | 9/2011 | Murakoshi ........ | H01L 27/14685 257/E31.127 |
| 2012/0146198 A1 | 6/2012 | Yang et al. | |
| 2013/0240960 A1 | 9/2013 | Kim et al. | |
| 2013/0323875 A1 | 12/2013 | Park et al. | |
| 2014/0035089 A1 | 2/2014 | Qian et al. | |
| 2014/0070353 A1 | 3/2014 | Kim | |
| 2015/0008555 A1 | 1/2015 | Mizuta et al. | |

(Continued)

OTHER PUBLICATIONS

Office Action for the U.S. Appl. No. 17/007,906 issued by the USPTO dated Jun. 3, 2022.

(Continued)

*Primary Examiner* — Herve-Louis Y Assouman (74) *Attorney, Agent, or Firm* — IP & T Group LLP (57) ABSTRACT

An image sensor device is disclosed, which blocks noise of a pad region. The image sensor device includes a substrate including a first surface and a second surface that are arranged to face each other, a pad disposed over the first surface of the substrate, and a through silicon via (TSV) formed to penetrate the substrate, and disposed at both sides of the pad in a first direction.

18 Claims, 6 Drawing Sheets

(56) References Cited

U.S. PATENT DOCUMENTS

| | | |
|---|---|---|
| 2016/0172402 A1* | 6/2016 | Katkar ............... H01L 27/1469 257/292 |
| 2016/0379960 A1 | 12/2016 | Huang et al. |
| 2017/0040374 A1* | 2/2017 | Oh ....................... H01L 21/187 |
| 2018/0040553 A1* | 2/2018 | Tak ..................... H01L 23/5256 |
| 2018/0061779 A1* | 3/2018 | Takazawa ......... H01L 27/14636 |
| 2019/0043902 A1 | 2/2019 | Lee et al. |
| 2019/0143439 A1 | 5/2019 | Shin et al. |
| 2019/0148439 A1 | 5/2019 | Shin et al. |
| 2019/0348459 A1 | 11/2019 | Katkar |
| 2019/0386054 A1 | 12/2019 | Chuang et al. |
| 2021/0043792 A1 | 2/2021 | Iwata |

OTHER PUBLICATIONS

"Bipolar Junction Transistor," Web page <https://en.wikipedia.org/wiki/Bipolar_Junction_transistor>, 12 pages, Mar. 15, 2019, retrieved from Internet Archive Wayback Machine <https://web.archive.org/web/20190326183710/https://en.wikipedia.org/wiki/Bipolar_Junction_transistor> on Aug. 16, 2022.

Office Action for the U.S. Appl. No. 16/990,699 issued by the USPTO dated Aug. 24, 2022.

* cited by examiner

IMAGE SENSOR DEVICE

CROSS-REFERENCE TO RELATED APPLICATION

This patent document claims the priority and benefits of Korean patent application No. 10-2020-0039786, filed on Apr. 1, 2020, which is hereby incorporated in its entirety by reference.

TECHNICAL FIELD

The embodiments of the present invention relate generally to image sensor technology, and more particularly, to a technology for blocking the noise of and/or minimizing the parasitic capacitance of a pad area of an image sensor.

BACKGROUND

An image sensor converts an optical image into electrical signals. Recently, because of increased research and development in the computer and communication industries, demand for high-quality, high-performance image sensors is rapidly increasing in various applications and fields, such as, for example, digital cameras, camcorders, personal communication systems (PCSs), game consoles, surveillance cameras, medical micro-cameras, and the like.

Specifically, MOS image sensors can be driven more easily, and can be implemented using many more scanning schemes. The MOS image sensor may include one or more photoelectric conversion elements configured to sense the magnitude of incident light and a multilayer metal line layer configured to output light signals stored in the photoelectric conversion elements. However, the incident light may be reflected by the metal line layer, and may be absorbed by an interlayer insulation film, resulting in reduction in sensitivity. In addition, the reflected light may be absorbed into contiguous (or adjacent) pixels, resulting in an occurrence of crosstalk.

Therefore, an improved structure has been proposed, which polishes a backside of a substrate and receives light incident from the backside of the substrate. The improved structure may be referred to as a backside illuminated (BSI) image sensor. Since the metal line layer is not formed over a backside upon which light is incident in the BSI image sensor, the incident light is not reflected by the metal line layer and light absorption does not occur by an interlayer insulation film.

SUMMARY

Various embodiments of the disclosed technology relate to an image sensor device for reducing noise and parasitic capacitance of a pad area.

In accordance with an embodiment of the disclosed technology, an image sensor device may include a substrate including a first surface and a second surface that are located to face each other, a pad disposed over the first surface of the substrate, and a through silicon via (TSV) formed to penetrate the substrate, and disposed at both sides of the pad in a first direction.

In accordance with another embodiment of the disclosed technology, an image sensor device may include a substrate in which a pad area and a circuit area located contiguous to the pad area are defined, a pad disposed over a first surface of the substrate in the pad area, and a through silicon via (TSV) formed to penetrate the substrate, and disposed at both sides of the pad in a first direction within the pad area.

In accordance with still another embodiment of the disclosed technology, an image sensor device may include a pad formed in a center area of a substrate, and a first through silicon via (TSV) formed to omnidirectionally surround the pad at an outer edge portion of the pad, such that the substrate including the pad is floated.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

The present disclosure provides implementations and examples of an image sensor device that substantially addresses one or more issues due to limitations and disadvantages of the related art. Various implementations of the disclosed technology are directed to an image sensor device which can block noise of a pad area and/or can minimize parasitic capacitance of the pad area. In recognition of the issues above, the disclosed technology provides various implementations of an image sensor device which can reduce noise and parasitic capacitance of the pad area.

Reference will now be made in detail to embodiments of the disclosed technology, examples of which are illustrated in the accompanying drawings. Wherever possible, the same reference numbers are used throughout the drawings to refer to the same or like portions.

Advantages and features of the disclosed technology, and a method of achieving the advantages and features of the disclosed technology will be clearly understood from embodiments described hereinafter in conjunction with the accompanying drawings. However, the disclosed technology is not limited to the following embodiments and may be realized in various different forms. These embodiments are provided to completely disclose the technology, and are provided for a person having ordinary skill in the art to which the disclosed technology pertains, to completely understand the disclosure. However, it is understood that the skilled person would envisage numerous variations of the disclosed implementations and examples without departing from the scope and spirit of the disclosed technology as defined in the appended claims. In the drawings, the sizes or relative sizes of layers and areas may be exaggerated for clarity of description.

The terminology used herein is for the purpose of describing particular embodiments only and is not intended to be limiting of the disclosed technology. As used herein, the singular forms are intended to include the plural forms as well, unless the context clearly indicates otherwise. It will be further understood that the terms "comprises," "comprising," "includes" and/or "including" when used in this specification, specify the presence of stated constituent elements, steps, operations, and/or components, but do not preclude the presence or addition of one or more other constituent elements, steps, operations, and/or components thereof. The term "and/or" may include a combination of a plurality of items or any one of a plurality of items. The same reference numbers will be used throughout this specification to refer to the same or like constituent elements.

In the description of the disclosed technology, the terms "first", "second" and the like may be used to describe various elements, components, and/or sections, but the elements, components, and/or sections are not limited by these terms. These terms may be used to distinguish one component, one constituent element, or one section from another component, another constituent element, or another section. Therefore, a first element, a first constituent element, or a first section may also be called a second element, a second constituent element, or a second section without departing from the scope of the disclosed technology.

When an element or a layer is referred to as being "on" another element or another layer, it can be directly on the element or the layer, or one or more intervening elements or layers may also be present. In contrast, when an element or a layer is referred to as being "directly on" another element or another layer, it means that no intervening elements or layers are present. The term "and/or" may include a combination of a plurality of items, or any one of a plurality of items.

Spatially relative terms such as "below," "beneath," "lower," "above," or "upper" may be used herein to describe one element's relationship to another element as illustrated in the drawings. It will be understood that spatially relative terms are intended to encompass different orientations of the elements during the use or operation of the elements in addition to the orientation depicted in the drawings. Wherever possible, the same reference numbers will be used throughout the specification to refer to the same or like elements.

Furthermore, the embodiments described herein may be understood with reference to cross-sectional views and plan views, that is, ideal exemplary diagrams of the disclosed technology. Accordingly, forms of the exemplary diagrams may be changed by fabrication technology and/or tolerance. Accordingly, the embodiments of the disclosed technology are not limited to the illustrated specific forms, but may include changes in forms generated according to a fabrication process. Accordingly, areas illustrated in the drawings have schematic attributes, and the shapes of the illustrated areas are intended to illustrate a specific form of an area of the element (or device) but are not intended to limit the scope of the disclosed technology.

Figure 1:
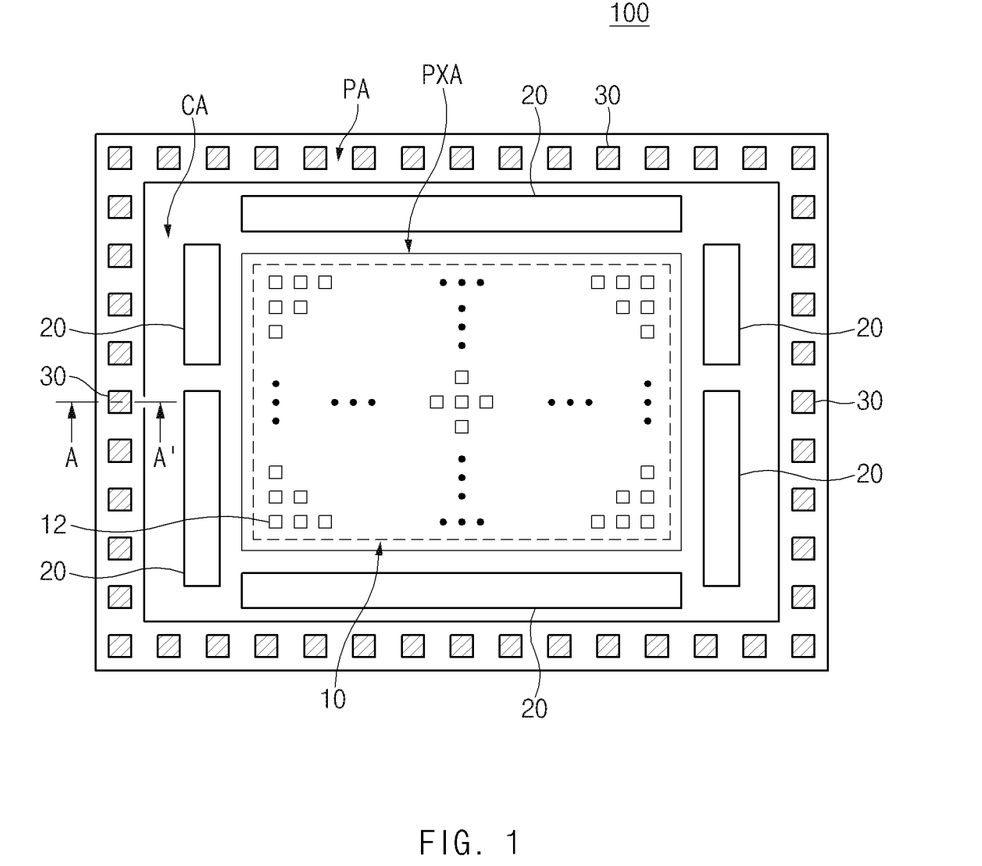
FIG. 1 is a schematic plan view illustrating an example of an image sensor device based on various implementations of the disclosed technology.
Figure 2:
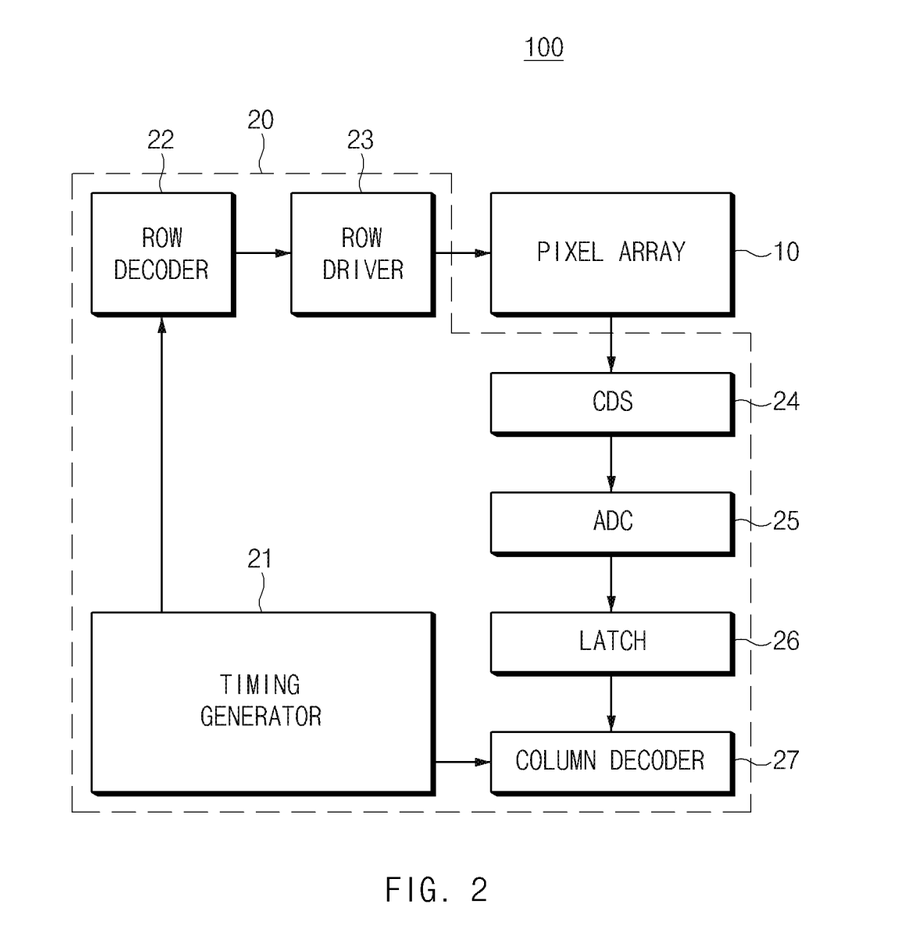
FIG. 2 is a block diagram illustrating an example of some constituent elements of an image sensor device based on various implementations of the disclosed technology.

FIG. 1 is a schematic plan view illustrating an example of an image sensor device 100 based on various implementations of the disclosed technology. FIG. 2 is a block diagram illustrating an example of some constituent elements of the image sensor device 100 based on various implementations of the disclosed technology.

Referring to FIGS. 1 and 2, the image sensor device 100 may include a pixel area PXA, a circuit area CA, and a pad area PA.

The pixel area PXA may include a pixel array 10 in which a plurality of unit pixels 12 is arranged in a matrix shape. Each of the plurality of unit pixels 12 may include a photoelectric conversion element (not shown).

The circuit area CA may be formed around the pixel area PXA, and may include a plurality of circuits 20. The circuit area CA may include a plurality of CMOS transistors (not shown). The circuit area CA may transmit a predetermined signal to each unit pixel 12 of the pixel array 10. The circuit area CA may control an output signal at each unit pixel 12. The pad area PA may include a plurality of pads 30 located contiguous to the circuit area CA. The plurality of pads 30 may be spaced apart from each other in a single file in the pad area PA as shown in FIG. 1 for example. However, the invention may not be limited in this way. For example, in other implementations of the invention a double file of pads 30 may be employed.

Referring to FIG. 1, the circuit area CA may be defined to surround the pixel area PXA, and the pad area PA may be defined to surround the circuit area CA, without being limited thereto. For example, in variations of the described implementation, the circuit area CA may not surround the pixel area PXA. Also, the pad area PA may be formed at fewer than all the sides of the circuit area. For example, the pad area may be formed only at three sides, or only at two sides or only at one side of the circuit area CA. In an implementation, for example, the circuit area CA may not surround the pixel area PXA and the pad area PA may be formed at only one side of the circuit area CA.

Referring to FIG. 2, one or more of the plurality of circuits 20 formed in the circuit area CA may include a timing generator 21, a row decoder 22, a row driver 23, a correlated double sampler (CDS) circuit 24, an analog-to-digital converter (ADC) circuit 25, a latch circuit 26, and a column decoder 27.

The pixel array 10 included in the pixel area PXA may receive a plurality of drive signals, for example, a row selection signal, a reset signal, and a charge transfer signal, from the row driver 23, and may be driven by the received drive signals. In addition, electrical signals acquired by photoelectric conversion in the pixel array 10 may be provided to the CDS circuit 24.

The timing generator 21 may transmit a timing signal and control signals to the row decoder 22 and the column decoder 27. Upon receiving the decoded result from the row decoder 22, the row driver 23 may transmit a plurality of drive signals needed to drive the plurality of unit pixels 12 to the pixel array 10 of the pixel area PXA. If the plurality of unit pixels 12 is arranged in a matrix, the row driver 23 may provide a drive signal for each row of the matrix.

The CDS circuit 24 may receive output signals from the pixel array 10 of the pixel area PXA, and may hold and sample the received output signals. That is, the CDS circuit 24 may perform double sampling of a signal level caused by each output signal and a specific noise level, and may thus output a level difference corresponding to a difference between the noise level and the signal level.

The ADC circuit 25 may convert an analog signal corresponding to the level difference into a digital signal, and may output the digital signal. The latch circuit 26 may latch digital signals received from the ADC circuit 25 and may output the latched signals sequentially to an image signal output circuit (not shown) in response to the decoded result acquired by the column decoder 27.

In some implementations, the image sensor device 100 may be a BSI image sensor. In addition, light may be incident upon the pixel area PXA from the same surface as an exposure surface on which the plurality of pads 30 is exposed outside from among a plurality of exposure surfaces of the image sensor device 100.

The plurality of pads 30 may be electrically coupled to a plurality of wells formed in the circuit area CA through connection lines. In some implementations, the plurality of pads 30 may be formed of metal, metal nitride, or a combination thereof. In some implementations, the plurality of pads 30 may transmit and receive electrical signals to and from an external device. In other implementations, the plurality of pads 30 may transfer a driving power source, such as a power-supply voltage or a ground voltage received from an external source, to circuits included in the circuit area CA through a connection line.

Figure 3:
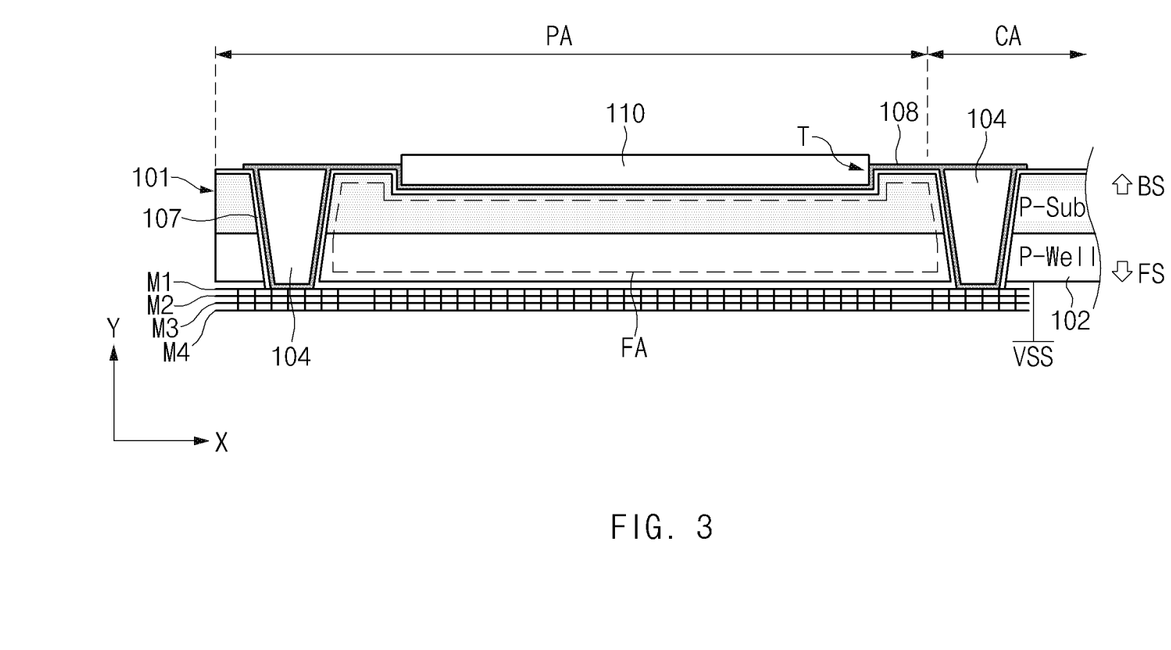
FIG. 3 is a cross-sectional view illustrating an example of the image sensor device shown in FIG. 1 based on various implementations of the disclosed technology.

FIG. 3 is a cross-sectional view illustrating an example of the image sensor device 100 shown in FIG. 1 based on various implementations of the disclosed technology. In more detail, FIG. 3 is a cross-sectional view illustrating the pad area PA taken along the line A-A' in the image sensor device 100 shown in FIG. 1.

Referring to FIG. 3, a circuit area CA and a pad area PA may be defined in a substrate 101. The substrate 101 may include a front side (FS) and a back side (BS) that are arranged to face each other. One side of the substrate 101 can be defined as the front side (FS) and the other side of the substrate 101 can be defined as the back side (BS), without being limited thereto. For example, unit elements may be formed over the front side (FS) of the substrate 101, and light may be emitted to the back side (BS) of the substrate 101. For example, unit elements may be formed over the back side (BS) of the substrate 101, and light may be emitted to the front side (FS) of the substrate 101. The substrate 101 may be a suitable substrate. For example, the substrate 101 may be a P-type bulk substrate. Also, for example, the substrate 101 may be an N-type bulk substrate. The substrate may include growing an epitaxial layer on the bulk substrate. The epitaxial layer may be a P-type epitaxial layer. The epitaxial layer may be an N-type epitaxial layer. For example, the substrate may be a substrate formed by growing a P-type or N-type epitaxial layer on an N-type bulk substrate or on a P-type bulk substrate. The substrate 101 may be formed of an organic plastic substrate rather than a semiconductor substrate. Examples of organic plastic substrates may include substrates made of organic small molecules or polymers. Organic small molecules may include, for example, polycyclic aromatic compounds, such as pentacene, anthracene, and rubrene. Suitable polymers may include, for example, fluoropolymers such as PVDF (polyvinylidene fluoride) or PVDF copolymers such as PVDF copolymers with trifluoroethylene. In some implementations, a P well 102 may be formed at the front side (FS) contained in the P-type substrate 101.

A plurality of lines M1~M4 for signal transmission may be disposed over the front side (FS) of the substrate 101. The plurality of lines M1~M4 may be sequentially stacked in an interlayer insulation film (not shown). For example, each of the plurality of lines M1~M4 may include metal. For example, the plurality of lines M1~M4 may include copper (Cu), platinum (Pt), tungsten (W), aluminum (Al), an alloy layer formed of the above materials, and the like. The number of layers of the plurality of lines M1~M4 and structure types of the plurality of lines M1~M4 may not be limited thereto, and the plurality of lines M1~M4 may be formed in various numbers of layers and various types of structures according to device design methods.

A conductive film 108 may be disposed over the back side (BS) of the substrate 101. The conductive film 108 may be formed over the substrate 101. The conductive film 108 may be formed to cover a top surface of the back side (BS) of the substrate 101. The conductive film 108 may be formed in direct contact with the top surface of the back side (BS) of the substrate 101. The conductive film 108 may be formed to be longer than the pad 110 in an X-axis direction parallel to the substrate 101. The conductive film 108 may be formed to be thinner than the pad 110 in a Y-axis direction. The Y-axis may be vertical to the X-axis. The conductive film 108 may extend to cover at least partially both sides of the pad 110, and may be coupled to a top surface of a TSV 104. The conductive film 108 may be disposed over a trench (T) formed to expose some parts of the back side (BS) of the substrate 101.

The conductive film 108 may be formed to prevent the substrate 101 from being damaged in a patterning process needed to form the pad 110. For example, the conductive film 108 may include metal, such as, for example, tungsten (W).

The pad 110 may be disposed over the conductive film 108 of the substrate 101. The pad 110 may be formed directly on the conductive film 108 of the substrate 101. The pad 110 may be a constituent element corresponding to the pad 30 shown in FIG. 1. The pad 110 may be formed along a top surface and the sidewalls of the conductive film 108 which is formed conformally in the trench (T). In addition, the pad 110 and the plurality of lines M1~M4 may be electrically coupled to each other via the conductive film 108 and the through silicon via 104 which is formed to penetrate the substrate 101 and contact the lines M1~M4. More specifically, a top surface of the TSV 104 may directly contact the conductive film 108 and a bottom surface of the TSV 104 may directly contact at least one of the metal lines M1~M4. The pad 110 may include one or more metal materials, for example, aluminum (Al), copper (Cu), etc.

An insulation layer 107 may be formed at sidewalls of the TSV 104, and may also be formed below the conductive film 108. The insulation layer 107 may be formed as an isolation pattern by which the TSV 104 and the substrate 101 can be electrically isolated from each other. The insulation layer 107 may be formed to prevent the TSV 104 and the conductive film 108 from being electrically coupled to (i.e., from being short-circuited to) the substrate 101.

In this case, the insulation layer 107 may be formed of only one insulation material. In another example, the insulation layer 107 may be formed by stacking at least two insulation patterns. The insulation layer 107 may be formed of oxide materials such as silicon oxide and metal oxide, or may be formed of nitride materials such as silicon nitride.

One or more TSVs 104 may be formed at both sides of the pad 110, and may penetrate the substrate 101 to contact the plurality of lines M1~M4. The TSVs 104 are spaced apart from each other by a predetermined distance. A bottom surface of the TSVs 104 may be in contact with the plurality of lines M1~M4. Each of the TSVs 104 may have a sidewall slope in a manner that an inner width of TSV 104 becomes smaller in a downward direction from the back side (BS) of the substrate 101. Alternatively, although not shown in the drawings, the TSV 104 may also have a vertical sidewall slope.

Each TSV 104 may be formed by first forming a contact hole (not shown) penetrating the substrate 101, and then the contact hole (not shown) may be filled with a conductive material, resulting in the formation of the TSV 104. The TSV 104 may be formed to fill the contact hole (not shown). Alternatively, the TSV 104 may be conformally formed along sidewalls of the contact hole. The TSV 104 may be formed in any shape provided that that the conductive film 108 can be coupled to the plurality of lines M1~M4.

The image sensor device 100 based on some implementations of the disclosed technology may include TSVs 104 at both ends of the substrate 101. The TSVs 104 may be disposed in an area that does not overlap with the pad 110 in a direction (i.e., Y-axis direction) perpendicular to the pad 110.

That is, the image sensor device 100 based on various implementations of the disclosed technology may insulate the substrate 101 located in a lower area of the pad 110 using the TSVs 104, resulting in formation of a floated state. Thus, the image sensor device 100 can prevent parasitic capacitance from occurring between the pad 110 and the substrate 101.

Generally, the circuit area CA may not be disposed in a lower area of the pad 110 so as to prevent physical damage, and the same type of conductive materials as in the substrate 101 may be disposed over the lower area of the pad 110. In this case, parasitic capacitance may be formed between the pad 110 and the substrate 101.

Specifically, in the case of a backside illuminated (BSI) image sensor, signals applied to the pad 110 may be transferred to lower lines M1~M4 through the TSV 104. Therefore, excessive capacitance may be formed between the pad 110 and the substrate 101. If such capacitance between the pad 110 and the substrate 101 increases, transition of one or more input signals may become slower in speed. In addition, if a fast digital transition signal is transmitted to the pad 110, noise may be introduced into the substrate 101 through the pad 110.

To address these concerns, the image sensor device 100 may employ one or more TSVs 104 in the substrate 101, such that parasitic capacitance generated in the substrate 101 disposed below the pad 110 can be reduced.

Parasitic capacitance may be generated by insulation dielectric materials present between the pad 110 and the substrate 101. For example, only when a voltage is applied to a conductor disposed between both ends (i.e., between the pad 110 and the substrate 101) of the dielectric material due to characteristics of capacitance, parasitic capacitance may occur.

If a voltage is not applied to one side (e.g., the substrate 101) of the conductor such that the one side (i.e., the substrate 101) of the conductor is floated, capacitance may not occur in the other non-floated side (e.g., the pad 110) of the conductor.

In other words, a boundary area in which the pad 110 is in contact with the substrate 101 is relatively large in size, such that parasitic capacitance may occur in the boundary area. However, both sides of a lower floating area FA that is arranged perpendicular to the pad 110 in the Y-axis direction may be shielded by the TSVs 104.

A well bias may be applied to the image sensor device 100 through the substrate 101. For example, if an impurity area of the substrate 101 includes the P well 102, the well bias may be a ground voltage VSS. Alternatively, if the impurity area of the substrate 101 includes an N well (not shown), the well bias may be a power-supply voltage.

If one or more TSVs 104 are not formed in the vicinity of the circuit area CA, the well bias may be applied to the substrate 101, such that parasitic capacitance may occur in the substrate 101. However, a barrier structure may be formed below the pad 110 by the TSVs 104 omnidirectionally surrounding the pad 110 in a manner that the floating area FA is formed and the well bias is not applied to the formed floating area FA. As a result, coupling between the pad 110 and the substrate 101 is cut off, so that noise introduced into the substrate 101 through the pad 110 can be reduced.

Figure 4:
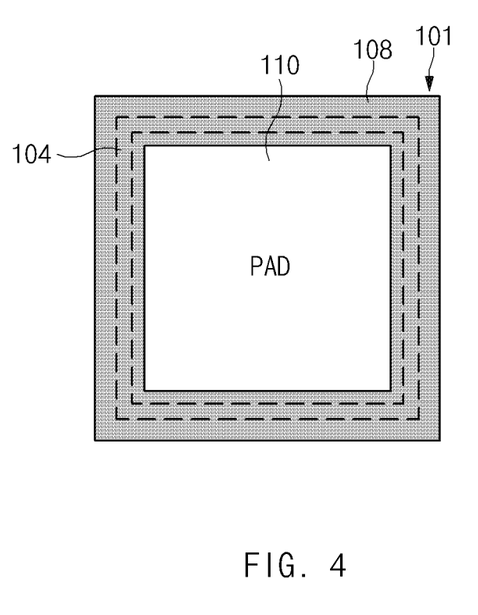
FIG. 4 is a plan view illustrating an example of the image sensor device shown in FIG. 3 based on various implementations of the disclosed technology.

FIG. 4 is a plan view illustrating an example of the image sensor device shown in FIG. 3 based on various implementations of the disclosed technology. In FIG. 4, the same constituent elements as those of FIG. 3 will be used to refer to the same or like parts for convenience of description and better understanding of the disclosed technology, and as such redundant matters thereof will herein be omitted for brevity.

Referring to FIG. 4, the pad 110 may be formed in a square or rectangular shape when viewed from the top. Also, the pad 110 may be formed at a center area of the substrate 101. The TSV 104 may be formed to omnidirectionally surround the pad 110 at an outer edge portion of the pad 110. For example, the TSV 104 may be formed in a square or rectangular ring shape, the center area of which includes the pad 110. A conductive film 108 may be formed between the pad 110 and the TSV 104.

If the TSV 104 is formed to omnidirectionally surround the pad 110, the pad 110 may be surrounded by one or more conductors such that the substrate 101 disposed below the pad 110 can enter a floated state. Accordingly, the area of the pad 110 is shielded so that capacitance is not generated in the direction from the pad 110 to the substrate 101. As a result, parasitic capacitance generated in the direction from the pad 110 to the substrate 101 within the pad area PA can be reduced.

Figure 5:
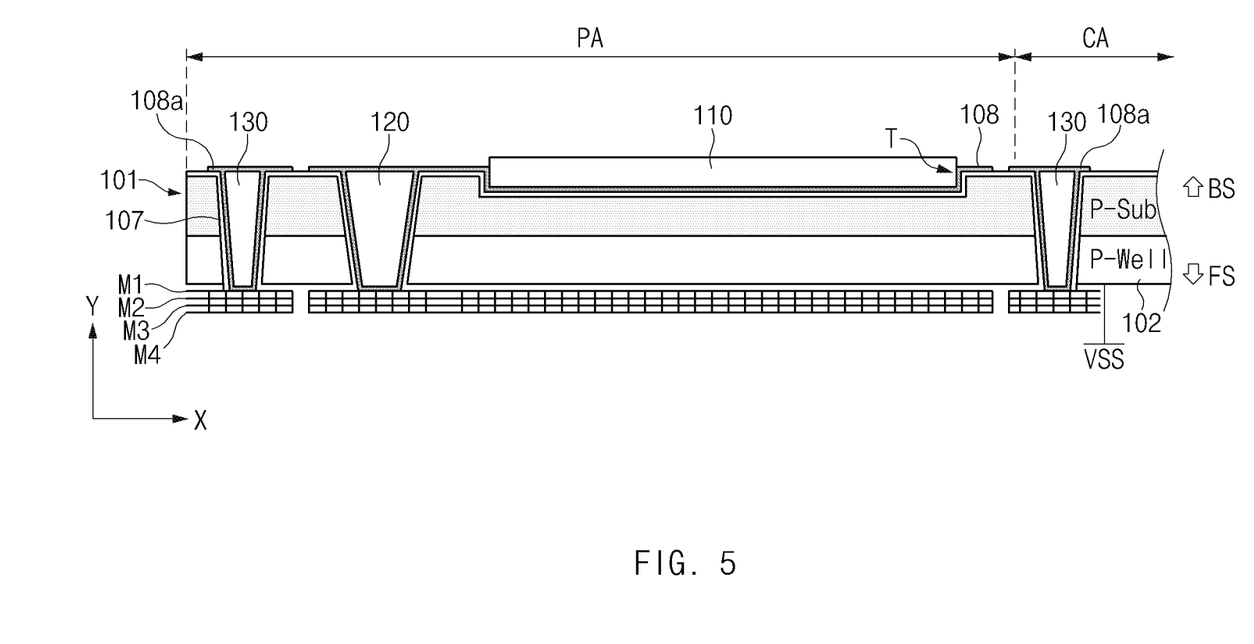
FIG. 5 is a cross-sectional view illustrating another example of the image sensor device shown in FIG. 1 based on various implementations of the disclosed technology.

FIG. 5 is a cross-sectional view illustrating another example of the image sensor device shown in FIG. 1 based on some implementations of the disclosed technology. In FIG. 5, the same constituent elements as those of FIG. 3 will be used to refer to the same or like parts for convenience of description and better understanding of the disclosed technology, and as such redundant matters thereof will herein be omitted for brevity.

Referring to FIG. 5, the conductive film 108 may extend to both sides of the pad 110, such that the extended conductive film 108 can be coupled to a top surface of the TSV 120. The conductive film 108a may be coupled to a top surface of the TSV 130. The pad 110 and the plurality of lines M1~M4 may be electrically coupled to each other by the TSV 120 penetrating the substrate 101. The conductive film 108a may be electrically coupled to the lower lines M1~M4 by the TSV 130 penetrating the substrate 101.

An insulation layer 107 may be formed at sidewalls of the TSVs 120 and 130, and may also be formed below the conductive films 108 and 108a. The insulation layer 107 may be formed as an isolation pattern by which the TSVs 120 and 130 and the substrate 101 can be electrically isolated from each other. The insulation layer 107 may be formed to prevent the TSV 120 and 130 and the conductive films 108 and 108a from being electrically coupled to (i.e., from being short-circuited to) the substrate 101.

The TSVs 120 and 130 may be formed in the substrate 101, and may pass through the substrate 101. The through silicon via TSV 120 may be formed to transmit signals of the pad 110 to the plurality of lines M1~M4. In addition, the TSV 130 may be formed to surround the pad 110 as well as to reduce parasitic capacitance generated in the direction from the pad 110 to the substrate 101. The TSV 130 may be formed to have a smaller thickness in the X-axis direction than the TSV 120. The TSV 130 may be formed in a thinner band shape than the TSV 120.

Bottom surfaces of the TSVs 120 and 130 may contact the plurality of lines M1~M4. The TSVs 120 and 130 may have a sidewall slope in a manner that an inner width of the TSV 120 or 130 becomes smaller in a downward direction from the back side (BS) of the substrate 101. Alternatively, although not shown in the drawings, the TSV 120 or 130 may also have a vertical sidewall slope.

Figure 6:
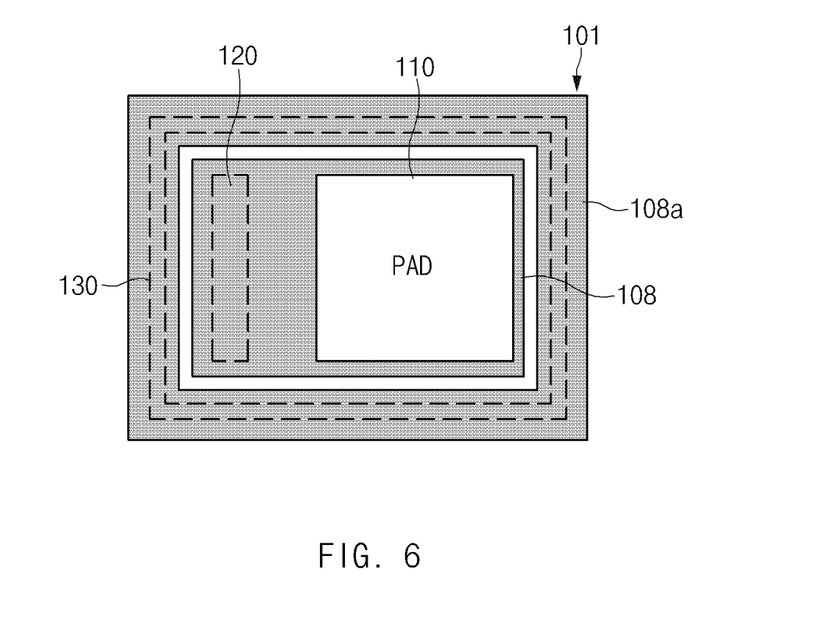
FIG. 6 is a plan view illustrating the image sensor device shown in FIG. 5 based on various implementations of the disclosed technology.

FIG. 6 is a plan view illustrating an example of the image sensor device shown in FIG. 5 based on various implementations of the disclosed technology. In FIG. 6, the same constituent elements as those of FIG. 5 will be used to refer to the same or like parts for convenience of description and better understanding of the disclosed technology, and as such redundant matters thereof will herein be omitted for brevity.

Referring to FIG. 6, the pad 110 may be formed in a square or rectangular shape at the center area of the substrate 101. The TSV 120 may be formed at one side of the pad 110. The TSV 130 may be located at the outer edge area of the pad 110 and the TSV 120, and may be formed to omnidirectionally surround the pad 110 and the TSV 120 except for those sides of the pad and the TSV 120 which face each other. The TSV 130 may be formed to have a smaller thickness than the TSV 120.

In other words, the TSV 130 may be formed in a thin rectangular shape, the center area of which includes the pad 110 and the TSV 120. The conductive films 108 and 108a may be formed in the outer edge area of the pad 110.

If the TSV 130 is formed to omnidirectionally surround the pad 110, the pad 110 may be surrounded by one or more conductors, such that the substrate 101 disposed below the pad 110 is floated. Accordingly, the area of the pad 110 may be electrically insulated, such that capacitance is not generated in the direction from the pad 110 to the substrate 101. As a result, parasitic capacitance that is generated in the direction from the pad 110 to the substrate 101 within the pad area PA can be reduced.

As is apparent from the above description, the image sensor device based on various implementations of the disclosed technology can reduce noise and parasitic capacitance of the pad area.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

While the present invention has been described with respect to the specific embodiments, it will be apparent to those skilled in the art that various changes and modifications may be made without departing from the spirit and scope of the invention as defined in the following claims.

What is claimed is:

1. An image sensor device comprising:
a substrate having a circuit region and a pad area disposed on one side of the circuit region, the substrate including a first surface and a second surface that are arranged to face each other;
a pad disposed over the first surface of the substrate in the pad area; and
a through silicon via formed to penetrate the substrate, and disposed at both sides of the pad in a first direction,
wherein the through silicon via is disposed in a different area without overlapping the pad in a second direction perpendicular to the pad, and
wherein the through silicon via is continuously formed to omnidirectionally surround all sides of the pad in a plane view.

2. The image sensor device according to claim 1, wherein:
an outer edge portion of the pad is insulated by the through silicon via in a plan view, resulting in formation of a floating area.

3. The image sensor device according to claim 1, wherein the pad is formed as a rectangular or square shape in a plan view.

4. The image sensor device according to claim 1, wherein:
in a plan view, the through silicon via is formed as a rectangular band shape including the pad therein.

5. The image sensor device according to claim 1, further comprising:
a conductive film disposed over the first surface of the substrate.

6. The image sensor device according to claim 5, wherein the conductive film is formed to extend in the second direction such that the extended conductive film is longer than the pad in the second direction.

7. The image sensor device according to claim 5, wherein the conductive film is formed over a trench exposing parts of the substrate.

8. The image sensor device according to claim 7, wherein the pad is formed along a top surface and a side surface of the conductive film formed over the trench.

9. The image sensor device according to claim 5, wherein the through silicon via is electrically coupled to the pad through the conductive film.

10. The image sensor device according to claim 1, further comprising:
a first conductive well formed in the second surface of the substrate.

11. The image sensor device according to claim 1, wherein the pad is electrically coupled to lower lines by the through silicon via.

12. An image sensor device comprising:
a substrate in which a pad area and a circuit area located contiguous to the pad area are defined;
a pad disposed over a first surface of the substrate in the pad area; and
a through silicon via formed to penetrate the substrate, and disposed at both sides of the pad in a first direction within the pad area, wherein the through silicon via is disposed in a different area without overlapping the pad in a second direction perpendicular to the pad, and wherein the through silicon via is continuously formed to omnidirectionally surround all sides of the pad in a plane view.

13. The image sensor device according to claim 12, wherein:

in a plan view, the pad is formed as a rectangular or square shape.

14. The image sensor device according to claim 12, wherein the through silicon via is formed in a rectangular band shape, a center area of which includes the pad.

15. An image sensor device comprising:

a pad formed in a center area of a substrate; and a first through silicon via formed to omnidirectionally surround the pad at an outer edge portion of the pad, such that the substrate including the pad is floated, wherein the through silicon via is disposed in a different area without overlapping the pad in a second direction perpendicular to the pad, and wherein the first through silicon via is continuously formed to surround all sides of the pad in a plane view.

16. The image sensor device according to claim 15, further comprising:

a second through silicon via formed at one side of the pad.

17. The image sensor device according to claim 16, wherein the first through silicon via is formed as a rectangular band shape which allows the center area to include the pad and the second through silicon via.

18. The image sensor device according to claim 16, wherein the first through silicon via is formed to have a smaller thickness than the second through silicon via.

* * * * *